(12) United States Patent
Gopalakrishnan et al.

(10) Patent No.: US 10,404,260 B2
(45) Date of Patent: *Sep. 3, 2019

(54) METHOD AND SYSTEM FOR A SAMPLED LOOP FILTER IN A PHASE LOCKED LOOP (PLL)

(71) Applicant: Maxlinear, Inc., Carlsbad, CA (US)

(72) Inventors: Sangeetha Gopalakrishnan, Carlsbad, CA (US); Sheng Ye, Carlsbad, CA (US); Vamsi Paidi, Carlsbad, CA (US); Raghava Manas Bachu, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/906,578

(22) Filed: Feb. 27, 2018

(65) Prior Publication Data

US 2018/0191357 A1 Jul. 5, 2018

Related U.S. Application Data

(63) Continuation of application No. 15/236,369, filed on Aug. 12, 2016, now Pat. No. 9,906,227.

(Continued)

(51) Int. Cl.
*H03L 7/00* (2006.01)
*H03L 7/085* (2006.01)
(Continued)

(52) U.S. Cl.
CPC .............. *H03L 7/085* (2013.01); *H03L 7/093* (2013.01); *H03L 7/099* (2013.01); *H03L 7/1974* (2013.01); *H03L 7/1976* (2013.01)

(58) Field of Classification Search
CPC ....... H03L 7/085; H03L 7/1976; H03L 7/099; H03L 7/093; H03L 7/1974
See application file for complete search history.

(56) References Cited

U.S. PATENT DOCUMENTS 5,202,906 A * 4/1993 Saito .................. H03L 3/00
327/105
5,563,921 A * 10/1996 Mesuda ............... H03L 7/093
327/156

(Continued)

OTHER PUBLICATIONS

A Discreet-Time Model for the Design of Type-II PLLS With Passive Sampled Loop Filters: Kevin J. Wang, Member, IEEE, and Ian Galton, Senior Member, IEEE; IEEE Transaction ONS Circuits and Systems-I: Regular Papers, vol. 58, No. 2, Feb. 2011.

*Primary Examiner* — Kenneth B Wells
(74) *Attorney, Agent, or Firm* — McAndrews, Held & Malloy

(57) ABSTRACT

Methods and systems for a sampled loop filter in a phase locked loop (PLL) may comprise a phase locked loop (PLL) comprising a phase frequency detector, a sampled loop filter comprising a plurality of capacitors and at least one switch, a plurality of voltage controlled oscillators (VCOs) coupled to said sampled loop filter, and a frequency divider. The PLL generates at least one clock signal, and the sampled loop filter samples an output signal from the phase frequency detector when an average of charge provided to a first of the plurality of capacitors in the sampled loop filter is zero. The frequency divider may be a fractional-N divider. A second switch in said sampled loop filter may have switching times that are non-overlapping with switching times of the at least one switch. Capacitors may be coupled to ground from each terminal of the second switch.

28 Claims, 7 Drawing Sheets

Related U.S. Application Data

(60) Provisional application No. 62/363,627, filed on Jul. 18, 2016, provisional application No. 62/204,826, filed on Aug. 13, 2015.

(51) Int. Cl.
*H03L 7/197* (2006.01)
*H03L 7/093* (2006.01)
*H03L 7/099* (2006.01)

(56) References Cited

U.S. PATENT DOCUMENTS

| | | | | |
|---|---|---|---|---|
| 5,903,197 | A * | 5/1999 | Kikugawa | H03L 7/093 327/157 |
| 6,583,675 | B2 * | 6/2003 | Gomez | H03D 7/165 331/17 |
| 7,145,400 | B2 * | 12/2006 | Horan | H03L 7/093 331/17 |
| 7,629,854 | B2 * | 12/2009 | Lin | H03L 7/0891 327/337 |
| 8,188,777 | B2 * | 5/2012 | Yamaguchi | H03L 7/0896 327/148 |
| 8,456,244 | B2 * | 6/2013 | Obkircher | H03L 7/08 331/16 |
| 8,692,595 | B1 * | 4/2014 | Mendel | H03L 7/183 327/147 |
| 9,906,227 | B2 * | 2/2018 | Gopalakrishnan | H03L 7/085 |

* cited by examiner

METHOD AND SYSTEM FOR A SAMPLED LOOP FILTER IN A PHASE LOCKED LOOP (PLL)

CLAIM OF PRIORITY

This patent application is a continuation of application Ser. No. 15/236,369 filed on Aug. 12, 2016, now U.S. Pat. No. 9,906,227, which makes reference to, claims priority to and claims benefit from the U.S. Provisional Patent Application Ser. No. 62/204,826, filed on Aug. 13, 2015, entitled "METHOD AND SYSTEM FOR A SAMPLED LOOP FILTER IN A PHASE LOCKED LOOP (PLL)," and U.S. Provisional Patent Application Ser. No. 62/363,627 filed on Jul. 18, 2016, entitled "METHOD AND SYSTEM FOR FILTERING IN A FRAC-N PLL."

Each of the above stated applications is hereby incorporated herein by reference in its entirety.

TECHNICAL FIELD

Aspects of the present application relate to communications. More specifically, certain embodiments of the disclosure relate to a method and a system for a sampled loop filter in a phase locked loop (PLL).

BACKGROUND

Existing methods and systems for voltage-controlled-oscillator (VCO) can introduce disturbances and/or handle such disturbances in an inefficient manner. In this regard, communication via wireless and/or wired connections may comprise reception and/or transmission of radio frequency (RF) signals. For example, communication devices may transmit and/or receive RF signals carrying exchanged data, with the RF signals being configured in accordance with corresponding wired and/or wireless protocols or standards. Accordingly, signal processing (e.g., of RF signals) must be performed during wireless and/or wired communications to enable proper exchange of information. Example signal processing operations may comprise filtering, amplification, up-conversion/down-conversion of baseband signals, modulation/demodulation, analog-to-digital conversions and digital-to-analog conversions, encoding/decoding, and/or encryption/decryption.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for a sampled loop filter in a phase locked loop (PLL), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Certain implementations of the disclosure may be found in a method and system for a sampled loop filter in a phase locked loop (PLL). Exemplary aspects of the disclosure may comprise in a phase locked loop (PLL) comprising a phase frequency detector, a sampled loop filter comprising a plurality of capacitors and at least one switch, a plurality of voltage controlled oscillators (VCOs) coupled to the sampled loop filter, and a frequency divider: generating at least one clock signal, where the sampled loop filter samples an output signal from the phase frequency detector when an average of charge provided to a first of the plurality of capacitors in the sampled loop filter is zero. The frequency divider may be a fractional-N divider, for example. A second switch in said sampled loop filter may have switching times that are non-overlapping with switching times of the at least one switch. Capacitors may be coupled to ground from each terminal of the second switch. Capacitors may be coupled to ground from each terminal of the at least one switch. The sampled loop filter may provide a filtered output voltage for the plurality of VCOs. A multiplexer coupled to the plurality of VCOs may feed back an output of one of the plurality of VCOs to the frequency divider. The at least one switch may also be sub-sampled.

Figure 1A:
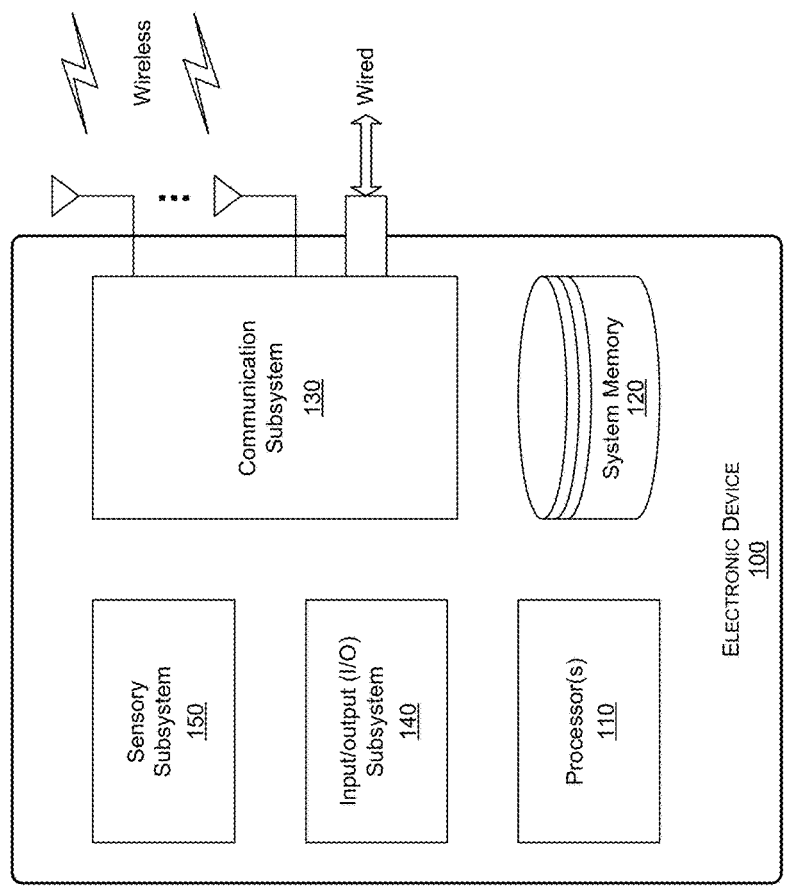
FIG. 1A illustrates an example electronic device that may utilize a voltage-controlled-oscillator (VCO) in accordance with various implementations of the disclosure.

FIG. 1A illustrates an example electronic device that may utilize a voltage-controlled-oscillator (VCO) in accordance with various implementations of the disclosure. Referring to FIG. 1A, there is shown an electronic device 100.

The electronic device 100 may comprise suitable circuitry, interfaces, logic, and/or code for implementing various aspects of the disclosures. In this regard, the electronic device 100 the electronic device may be configured to support performing, executing or running various operations, functions, applications and/or services. For example, the electronic device 100 may be operable to support, in some instances, such operations as communication operations, processing or handling of data, input/output operations, or the like. In this regard, the electronic device 100 may enable and/or support communication of data, such as via wired and/or wireless connections, which may be configured in accordance with one or more supported wireless and/or wired protocols or standards. To support input/output operations, the electronic device 100 may comprise components or subsystems for enabling interactions with a user (e.g., end-user or installer), so as to obtain user input and/or to provide user output. In some instances, the electronic device 100 may be a handheld mobile device—i.e., be intended for use on the move and/or at different locations. In this regard, the electronic device 100 may be designed and/or configured to allow for ease of movement, such as to allow it to be readily moved while being held by the user as the user moves, and the electronic device 100 may be configured to perform at least some of the operations, functions, applications and/or services supported by the device on the move. Examples of electronic devices may comprise set-top boxes, televisions, displays, gateways, modems, access points, femtocells, computers, cellular phones, smartphones, tablets, and or any other network node. The disclosure, however, is not limited to any particular type of electronic device.

The electronic device 100 may comprise, for example, one or more processors 110, a system memory 120, a communication subsystem 130, an input/output (I/O) subsystem 140, and a sensory subsystem 150.

The processor 110 may comprise suitable circuitry, interfaces, logic, and/or code that may be operable to perform general and/or specialized processing operations in the electronic device 110. For example, the processor 110 may comprise a general purpose processor (e.g., a central processing unit or CPU), a special purpose processor (e.g., graphics processing unit or GPU, or a visual processing unit or VPU), or the like. The disclosure, however, is not limited to any particular type of processor. When utilized as a general purpose processor, the processor 110 may be operable to, for example, process or handle data, control or manage operations of the electronic device 100, and/or handle or support tasks and/or applications performed therein. In this regard, the processor 110 may be utilized to configure and/or control operations of various components and/or subsystems of the electronic device 100, by utilizing, for example, one or more control signals. In some instances, however, the processor 110 may comprise a specialized processor, such as a video/graphics processor or a dedicated application processor that may be utilized for running and/or executing applications (or programs) in the electronic device 100.

The system memory 120 may comprise suitable circuitry, interfaces, logic, and/or code that may enable permanent and/or non-permanent storage, buffering, and/or fetching of data, code and/or other information, which may be used, consumed and/or processed. In this regard, the system memory 120 may comprise different memory technologies, including, for example, read-only memory (ROM), random access memory (RAM), Flash memory, solid-state drive (SSD), and/or field-programmable gate array (FPGA). The disclosure, however, is not limited to any particular type of memory or storage device. The system memory 120 may store, for example, configuration data, which may comprise parameters and/or code, comprising software and/or firmware. The disclosure is not limited, however, to any particular type of configuration data.

The communication subsystem 130 may comprise suitable circuitry, interfaces, logic, and/or code operable to communicate data from and/or to the electronic device, such as via one or more wired and/or wireless connections. The communication subsystem 130 may be configured to support one or more wired protocols and/or interfaces, and/or one or more wireless protocols and/or interfaces, facilitating transmission and/or reception of signals to and/or from the electronic device 100 and/or processing of transmitted or received signals in accordance with applicable wired or wireless protocols. Examples of wireless protocols or standards that may be supported and/or used by the communication subsystem 130 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 1G/2G+ (e.g., GSM/GPRS/EDGE, and IS-95 or cdmaOne) and/or 1G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 130 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the communication subsystem 130 comprise, for example, filtering, amplification, analog-to-digital conversion and/or digital-to-analog conversion, up-conversion/down-conversion of baseband signals, encoding/decoding, encryption/decryption, and/or modulation/demodulation.

The I/O subsystem 140 may comprise suitable circuitry, interfaces, logic, and/or code for enabling and/or managing user (e.g., end-user or installer) interactions with the electronic device 100, such as obtaining input from, and/or to providing output to, the device user(s). The I/O subsystem 140 may support various types of inputs and/or outputs, including, for example, video, audio, and/or text. In this regard, dedicated I/O devices and/or components, external to (and coupled with) or integrated within the electronic device 100, may be utilized for inputting and/or outputting data during operations of the I/O subsystem 140. Examples of such dedicated I/O devices may comprise displays, audio I/O components (e.g., speakers and/or microphones), mice, keyboards, touch screens (or touchpads), and the like. In some instances, user input obtained via the I/O subsystem 140, may be used to configure and/or modify various functions of particular components or subsystems of the electronic device 100.

The sensory subsystem 150 may comprise suitable circuitry, interfaces, logic, and/or code for obtaining and/or generating sensory information, which may relate to the electronic device 100, its user(s), and/or its environment.

For example, the sensory subsystem 150 may comprise ambient conditions (e.g., temperature, humidity, or light) sensors, positional or location sensors (e.g., GPS or other GNSS based sensors), and/or motion related sensors (e.g., accelerometer, gyroscope, pedometers, and/or altimeters).

In operation, the electronic device 100 may be utilized (e.g., by a user) to perform, execute and/or run various operations, functions, applications or services, such as using pre-configured instructions and/or based on real-time user instructions or interactions. In this regard, various types of operations, functions, applications or services may be available in or supported by the electronic device 100. For example, the electronic device 100 may be used for executing programs, playing video and/or audio content, gaming, email applications (and/or similar type of web based communications), calling services (e.g., voice calls), networking services (e.g., WiFi hotspot, Bluetooth piconet, and/or active 3G/femtocell data channels), or the like. The disclosure, however, is not limited to any particular type of operations, functions, applications or services.

In some instances, operations performed by the electronic device 100 may sometimes require generation of signals with particular characteristics, such as frequencies. For example, the electronic device 100 may be utilized in communication of data, such as using available wireless or wired connections. In this regard, data may be communicated using radio frequency (RF) signals, which may be communicated to and/or from the electronic device 100 over supported wired or wireless interfaces. Processing signals in the electronic device 100 may be performed using suitable components or circuits (e.g., in the communication subsystem 130), in which signals may be generated for use as baseband signals or carrier signals for example. The electronic device 100 may also be utilized in generating audio signals (e.g., for output via speakers), such as based on digital audio content obtained from local sources (storage media), remote sources (e.g., broadcast nodes), or user input (e.g., clicks corresponding to interactions with touchscreen). Various methods may be used in generating signals required by the electronic device 100. For example, one of the more common methods for generating signals (e.g., for use in signal processing) may be using oscillator circuits. In this regard, oscillator circuits may be operable to produce repetitive, oscillating electronic signal (e.g., a sine wave) based on some form of input (e.g., voltage). Signal generation in the electronic device 100 may, in some instances, entail or comprise frequency synthesis. In this regard, frequency synthesis may comprise generating various ranges of frequencies from a single fixed source (e.g., oscillator). Frequency synthesis may be used in such systems or applications as, for example, communications (e.g., radio receivers, mobile telephones, radiotelephones, walkie-talkies, satellite receivers, navigational systems, etc.), audio processing or the like. Frequency synthesis may comprise such operations as frequency multiplication, frequency division, and frequency mixing (the frequency mixing process generates sum and difference frequencies) operations to produce the desired output signal.

In an example implementation, the electronic device 100 may incorporate a plurality of phase-locked loop (PLL) circuits, for use in signal generation related operations. In this regard, a PLL may be operable to generate output signal(s) whose phase may be related to the phase of an input (reference) signal. PLL circuits may typically comprise some sort of variable frequency oscillator (e.g., voltage controlled oscillator or VCO) and a phase detector, with the phase detector being utilized to compare the phase of the reference signal with the phase of the signal derived from the output of the oscillator (e.g., to enable determining necessary adjustments to the frequency of its oscillator to keep the phases matched). The signal from the phase detector may then be used to control the oscillator in a feedback loop manner. Because frequency relates to phase (e.g., frequency is the time derivative of phase), keeping the input and output phase locked may allow keeping the input and output frequencies in lock as well. Consequently, PLLs may be utilized to track input frequencies, and/or to generate output frequencies related thereto (a frequency that is a multiple of an input frequency). Such frequency control may be utilized in various processing operations, such as demodulation, frequency synthesis, and the like. PLLs are widely employed in radio, communications, computers and other electronic applications. In this regard, PLLs may be utilized to enable recovering signals from a noisy communication channel, generate stable frequencies at a multiple of an input frequency (frequency synthesis), or distribute clock timing pulses various circuits or systems (e.g., microprocessors, such as the processors 110).

Signal generation (e.g., using PLL circuits) may be subject, in some instances, to disturbances, such as due to particular conditions that may affect the signal generation. In this regard, conditions that may affect signal generation may comprise environmental conditions (e.g., temperature), physical conditions (e.g., movement, rotation or shaking of system incorporating the signal generator), functional conditions—i.e., conditions relating directly to the signal generation (e.g., supply variations), and/or the like. The disclosure, however, is not limited to any particular type of conditions. Accordingly, in various implementations of the disclosure, an enhanced architecture may be utilized in implementing components (e.g., PLLs) used in generation of signals in electronic devices, such as the electronic device 100. In this regard, such enhanced architecture may enable expedited modification when changing output signals, and/or providing adaptive and dynamic tuning, to ensure that an output signal may be maintained when there may be a change in conditions affecting signal generation (e.g., change in temperature, which may be detected using the sensory subsystem 150 for example, voltage/supply variations, etc.). In addition, VCO architecture may be configured to mitigate the effect of noise generated from large voltage swings on the multiple VCO's that may be utilized in a multi-standard and/or multi-frequency system.

A frequency divider in a PLL feedback loop may comprise a fractional-N divider, which may create spurs at multiples of the sampling clock frequency, e.g., at 50 MHz, 100 MHz, and 150 MHz for a 300 MHz reference. In an example scenario, a sampling switch in a sampled loop filter may be closed when an average charge provided (dumped) is zero, e.g., after a +q and a −q charge is dumped into a capacitor. This is illustrated further in FIGS. 2-4.

Figure 1B:
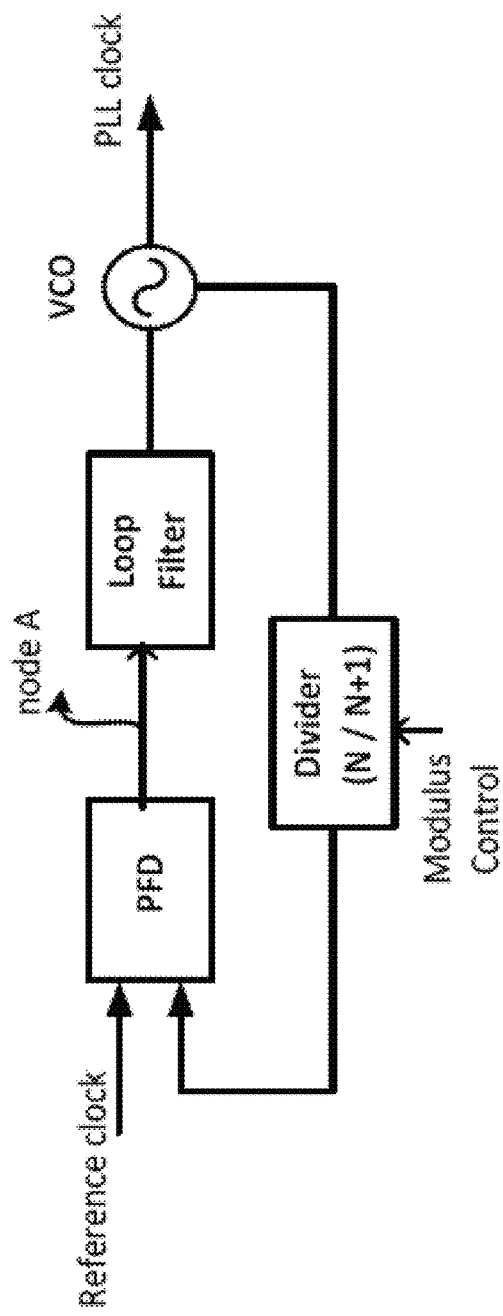
FIG. 1B shows an exemplary phase locked loop that uses fractional n synthesis, which may be used in accordance with various implementations of the disclosure.

FIG. 1B shows an exemplary phase locked loop that uses fractional n synthesis. In a fractional n (frac-n) PLL the divider may take on a fractional division ratio. To achieve this, the divider alternates between division ratios. Typically it will change between N and N+1. The proportion of each division ratio determines the required frequency. The division ratio range of N and N+1 gives frequencies between the two division ratios. Also a switched modulus counter giving counts between N and N+1 may be used. The effective division ratio may be calculated from the formula:

$$N_{eff} = \frac{A*N + B*(N+1)}{A+B}$$

Where Neff=overall division ratio; A=number of cycles divided by N; and B=number of VCO cycles divided by N+1.

Figure 2A:
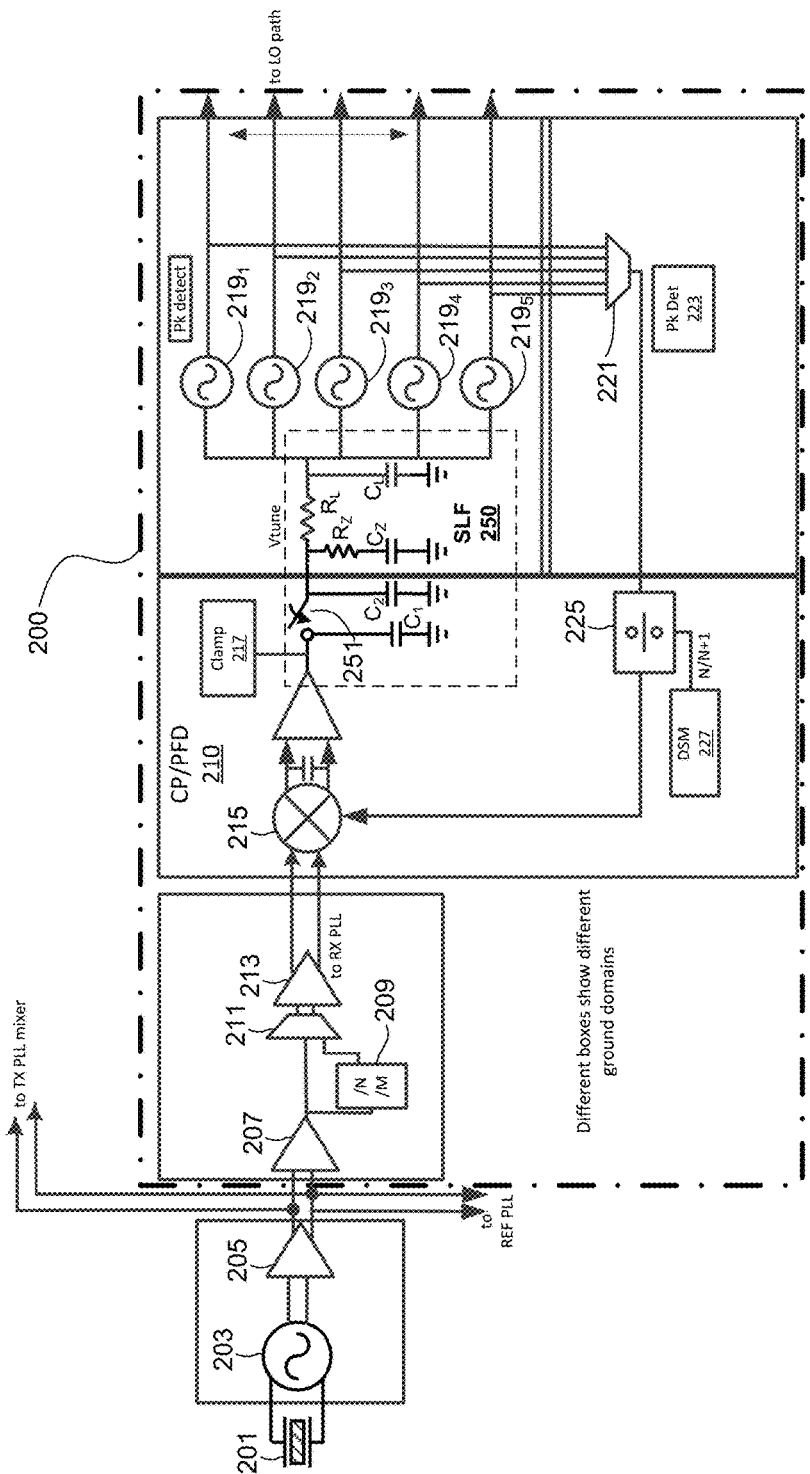
FIG. 2A is a block diagram illustrating an example coupling of a multi-core VCO, which may be used in accordance with various implementations of the disclosure.

FIG. 2A is a block diagram illustrating an example phase locked loop (PLL), which may be used in accordance with various implementations of the disclosure. Referring to FIG. 2A, there is shown an input reference clock 201 providing a clock signal to the PLL 200, which comprises a phase-frequency detector/charge pump block 210, sampled loop filter 250, a plurality of VCOs $219_1$-$219_5$, a prescaler buffer/MUX 221, and frequency divider 225.

The reference clock 201 may comprise a temperature-compensated crystal oscillator, for example, that feeds a stable clock to a surface acoustic wave (SAW) oscillator 203 and a reference buffer 205, for example. The output of the reference buffer 205 may provide a reference clock signal to multiple circuits, such as a Tx PLL, a reference PLL, and the Rx PLL shown in FIG. 2A.

The input of the Rx PLL may comprise a buffer 207 and a frequency divider 209, both coupled to a MUX 211 for selecting a frequency to be sent to a mixer 215 in the phase frequency detector/charge pump block 210 via gain stage 213.

The charge pump and phase frequency detector 210 may be operable to generate an error signal for controlling the VCOs $219_1$-$219_5$, where the error signal is proportional to the difference between the input clock signal and the VCO output. For instance, when the frequency of the output signal of the VCO $219_1$-$219_5$, fed back to the charge pump/phase frequency detector 210 via the prescaler buffer/MUX 221, is increasingly out of phase with the reference clock signal, the charge pump communicates a larger error signal to the VCO $219_1$-$219_5$ to adjust its output frequency.

The VCOs $219_1$-$219_5$ may comprise circuitry that generates an oscillating output signal at a frequency that may be proportional to an input voltage to the VCOs $219_1$-$219_5$. Accordingly, five oscillator signals may be generated by the circuit shown in FIG. 2A, although the disclosure is not so limited. Accordingly, any number of VCOs may be interconnected and configured based on power requirements, number of desired output frequencies, and chip space, for example.

The sampled loop filter 250 may comprise a switched resistor/capacitor network $C_1$, $C_2$, $C_Z$, $C_L$, $R_L$, and $R_Z$ where the switch 251 may be actuated at frequencies lower than the reference clock, i.e., sub-sampled. A fractional-N divider may create spurs at lower multiple sub-harmonics of the reference clock, e.g., at 50 MHz, 100 MHz, and/or 150 MHz for a 300 MHz reference. The capacitors on each side of the switch may be equal in value and the left capacitor may receive charges dumped from the charge pump.

In an example scenario, the sampling switch 251 in the sampled loop filter 250 may be closed when the average charge dumped is zero, e.g., after +q and −q charge has been dumped into the capacitor C1 from the prescaler frequency divider 225, e.g., a fractional-N divider. In this manner, the right side of the switch 251, labeled Vtune in FIG. 2A, may be isolated from spurs and remain nearly flat, thereby providing a filtered voltage without spurs to the VCOs $219_1$-$219_5$. The phase error due to noise may still be sampled at the reference frequency and stored on the capacitor, but the correction only applied at the sub-rate, e.g., 50 MHz for a 300 MHz reference.

Figure 2B:
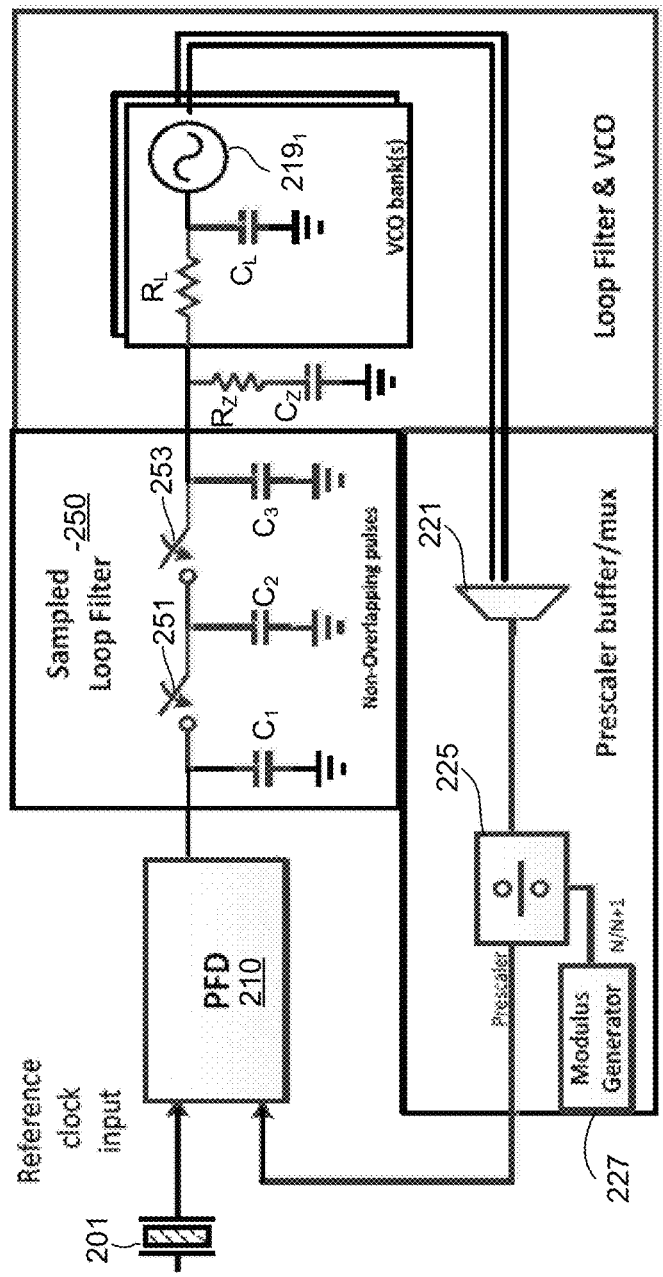
FIG. 2B shows another exemplary phase locked loop that uses fractional n synthesis.

FIG. 2B shows another exemplary phase locked loop that uses fractional n synthesis. The PLL of FIG. 2B, may be substantially similar to that shown in FIG. 2A, but with an alternative sampled loop filter 250, and may comprise M VCOs $219_1$-$219_M$. In FIG. 2B, the PLL is driven by a reference clock 201 from an external oscillator. A phase-frequency detector (PFD) 210 may be used to lock the PLL to the desired output frequency. The reference clock may be divided down to produce the required switching clock for the loop filter 250. In this case the division series may be five N's followed by one N+1. The loop filter 250 can be implemented using only one switch if the requirement on spur suppression is not stringent, as shown in FIG. 2A.

Figure 3A:
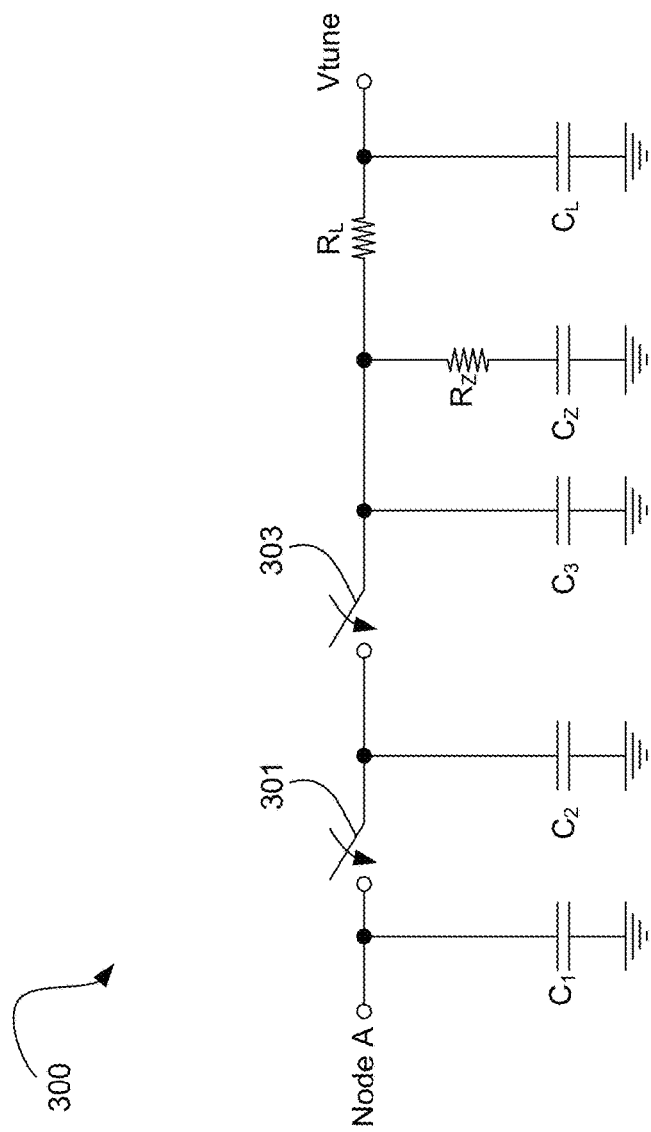
FIG. 3A shows an exemplary filter for a phase locked loop that uses fractional n synthesis, which may be used in accordance with various implementations of the disclosure.

FIG. 3A illustrates a sampled loop filter, which may be used in accordance with various implementations of the disclosure. Referring to FIG. 3A, there is shown a sampled loop filter 300 as utilized in the PLL circuit of FIG. 2B. The loop filter 300 comprises capacitors $C_1$-$C_3$, $C_Z$, and $C_L$, resistors $R_Z$ and $R_L$, and switches SW1 301 and SW2 303 driven by sampling clocks. In an example scenario, C1 may equal C2.

FIG. 3A shows an exemplary filter for a phase locked loop that uses fractional n synthesis, which may be used in accordance with various implementations of the disclosure. In FIG. 3A, node A is operably coupled to a first capacitive load C1 and a first port of a first switch 301. A second port of switch 301 is operably coupled to a second capacitive load C2 and a first port of a second switch 303. A second port of switch 303 is operably coupled to a third capacitive load C3, a first terminal of first resistive element $R_Z$, and a first terminal of second resistive element $R_L$. A second terminal of the resistor $R_Z$ is operably coupled to a fourth capacitive load $C_Z$. A second terminal of resistor $R_L$ is operably coupled to a fifth capacitive load $C_L$ and the output of the filter 300.

The period of the sampling clocks controlling switches 301 and 303 may be based on the number of N and N+1 divisors. For example, if the VCO clock is divided by one N followed by one N+1, the period of the sampling clock controlling switches 301 and 303 is 2× the length of the period of the reference clock (i.e., the sample clock frequency is the reference clock frequency divided by 2). As another example, if the VCO clock is divided by five N's followed by one N+1, the period of the sampling clock controlling switches 301 and 303 is 6× the length of the period of reference clock (i.e., the sample clock frequency is the reference clock frequency divided by 6). For fref=300 MHz, the frac-N operation creates spurs at, for example, 50 MHz, 100 MHz, or 150 MHz, depending on the division pattern used. The period of the sampling clock of the loop filter may be equal to the highest common period of the frac-N modulus to filter the reference spurs due to this frac-N operation. For an integer N-PLL, a switched loop filter (SLF) may also be used for deterministic suppression of a given spur.

The closing times for switches 301 and 303 may be non-overlapping to create a sample and hold switch to reduce reference spurs further. In a locked state, the right hand side of the switch 303 (vco vtune) is without spurs, as shown in FIG. 3B.

In operation, the capacitor $C_1$ may receive charges dumped from the charge pump when the VCO is out of phase with the reference clock, and due to the fractional-N divider in the PLL, may also receive charge spurs at sub-harmonics of the reference clock. The sampling clock for switch 301 may be configured to sample the Node A voltage at intervals such that the average charge dumped is zero, i.e., after +q and −q charges have been dumped. This may result in the voltage Vtune being flat and without spurs.

Figure 3B:
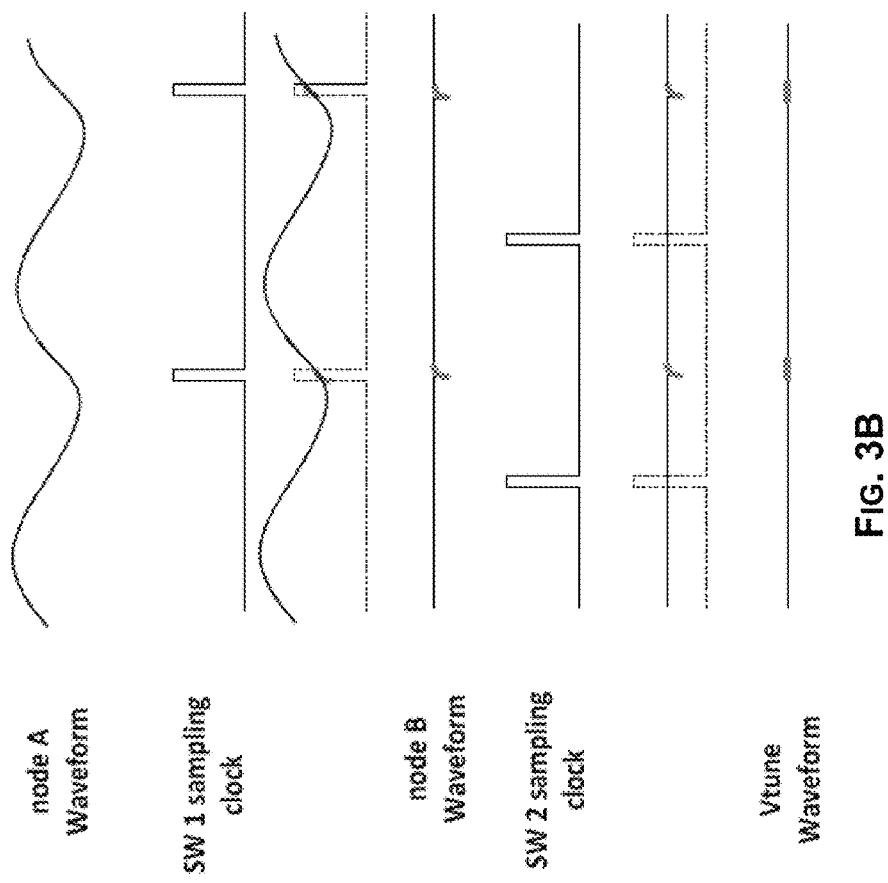
FIG. 3B illustrates timing diagrams and node waveforms for the sampled loop filter, which may be used in accordance with various implementations of the disclosure.

FIG. 3B illustrates timing diagrams and node waveforms for the sampled loop filter, which may be used in accordance with various implementations of the disclosure. Referring to FIG. 3B, there is shown the waveform at Node A of FIG. 3A, which may represent the input signal to be sampled, the sampling clocks for the switches 301 and 303, the Node B waveform, and the Vtune, or output, waveform. Regarding FIG. 3A and FIG. 3B, the phase error due to noise is integrated, and stored on the first capacitor C1 and sampled every sampling clock cycle. As noted in FIG. 3B and described with respect to FIG. 3A, the voltage waveform Vtune may remain flat without spurs, due to the sampling switch being closed when the average charge dumped is zero.

Figure 4:
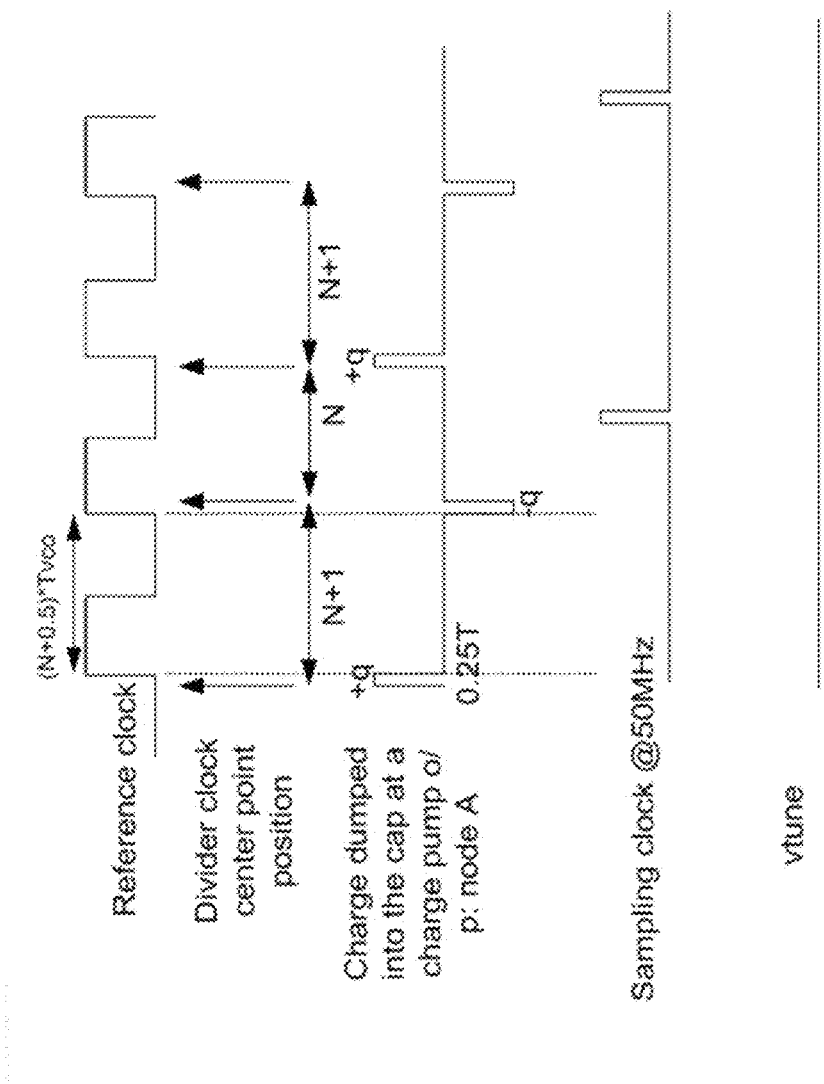
FIG. 4 illustrates timing signals for the sampled loop filter, which may be used in accordance with various implementations of the disclosure.

FIG. 4 illustrates timing signals for the sampled loop filter, which may be used in accordance with various implementations of the disclosure. Referring to FIG. 4, there is shown the timing signal for the reference clock, the divider clock center point position, the charge dumped to the capacitor $C_1$, the sampling clock for the loop filter, and the voltage at Vtune.

As shown, the sampling clock has a lower frequency than the reference clock. While 50 MHz is shown, this frequency is merely an example, and other clock frequencies are possible, depending on circuit needs and reference clock used, for example.

The charge dumped into the capacitor $C_1$ is shown in FIG. 4, with +q or −q charge dumped at each upward clock transition of the reference clock, where the fractional-N divider is split between divider values of N and N+1. The +q and −q therefore are dumped into the capacitor at the reference clock frequency, e.g., 100 or 300 MHz in this example, whereas the loop filter may be sub-sampled at a slower rate after +q and −q charges have been dumped, resulting in zero or near zero average charge. In this manner, the perturbations from the divider may be essentially evened out, as shown by the flat Vtune plot in FIG. 4.

In an embodiment of the disclosure, a system for a sampled loop filter in a phase locked loop (PLL) may comprise a phase locked loop (PLL) for generating at least one clock signal, where the PLL comprises a phase frequency detector; a sampled loop filter comprising a plurality of capacitors and at least one switch, a plurality of voltage controlled oscillators (VCOs) coupled to said sampled loop filter, and a frequency divider. The sampled loop filter may sample an output signal from the phase frequency detector when an average of charge provided to a first of the plurality of capacitors in the sampled loop filter is zero. The frequency divider may be a fractional-N divider, for example. A second switch in the sampled loop filter may have switching times that are non-overlapping with switching times of said at least one switch. Capacitors may be coupled to ground from each terminal of the second switch. Capacitors may be coupled to ground from each terminal of the at least one switch. The sampled loop filter may provide a filtered output voltage for the plurality of VCOs. A multiplexer coupled to the plurality of VCOs may feed back an output of one of the plurality of VCOs to the frequency divider. The at least one switch may also be sub-sampled.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a sampled loop filter in a phase locked loop (PLL).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A system, comprising:
   a phase locked loop (PLL) for generating at least one clock signal, said PLL comprising:
   a phase frequency detector;
   a sampled loop filter comprising a plurality of capacitors and at least one switch that operatively couples a pair of said plurality of capacitors together;
   a plurality of voltage controlled oscillators (VCOs) coupled to said sampled loop filter; and
   a frequency divider,
   wherein the sampled loop filter samples an output signal from the phase frequency detector when an average of charge provided to a first of the plurality of capacitors in the sampled loop filter is zero and wherein a second switch in said sampled loop filter has switching times that are non-overlapping with switching times of said at least one switch.

2. The system of claim 1, wherein said frequency divider is a fractional-N divider.

3. The system of claim 1, comprising a capacitor of said plurality of capacitors is coupled to ground from each terminal of said second switch.

4. The system of claim 1, wherein said sampled loop filter provides a filtered output voltage for said plurality of VCOs.

5. The system of claim 1, wherein a multiplexer coupled to said plurality of VCOs feeds back an output of one of said plurality of VCOs to said frequency divider.

6. The system of claim 1, wherein said at least one switch may be sub-sampled.

7. A method, comprising:
in a phase locked loop (PLL) comprising a phase frequency detector, a sampled loop filter comprising a plurality of capacitors and at least one switch that operatively couples a pair of said plurality of capacitors together, a plurality of voltage controlled oscillators (VCOs) coupled to said sampled loop filter, and a frequency divider:
generating at least one clock signal, wherein the sampled loop filter samples an output signal from the phase frequency detector when an average of charge provided to a first of the plurality of capacitors in the sampled loop filter is zero and wherein a second switch in said sampled loop filter has switching times that are non-overlapping with switching times of said at least one switch.

8. The method of claim 7, wherein said frequency divider is a fractional-N divider.

9. The method according to claim 7, wherein a capacitor of said plurality of capacitors is coupled to ground from each terminal of said second switch.

10. The method of claim 7, wherein said sampled loop filter provides a filtered output voltage for said plurality of VCOs.

11. The method of claim 7, wherein a multiplexer coupled to said plurality of VCOs feeds back an output of one of said plurality of VCOs to said frequency divider.

12. The method of claim 7, comprising sub-sampling said at least one switch.

13. A system, comprising:
a phase locked loop (PLL), said PLL comprising:
a phase frequency detector;
a sampled loop filter comprising a plurality of capacitors and at least one switch that operatively couples a pair of said plurality of capacitors together;
a plurality of voltage controlled oscillators (VCOs) coupled to said sampled loop filter; and
a frequency divider,
wherein said PLL is operable to:
sample an output signal from the phase frequency detector utilizing said at least one switch in said sampled loop filter when an average of charge provided to a first of the plurality of capacitors in the sampled loop filter is zero; and
generate a clock signal utilizing one of said plurality of VCOs that receives an output voltage from said sampled loop filter, wherein a second switch in said sampled loop filter has switching times that are non-overlapping with switching times of said at least one switch.

14. The system of claim 13, wherein said frequency divider is a fractional-N divider.

15. A system, comprising:
a phase locked loop (PLL) for generating at least one clock signal, said PLL comprising:
a phase frequency detector;
a sampled loop filter comprising a plurality of capacitors and at least one switch;
a plurality of voltage controlled oscillators (VCOs) coupled to said sampled loop filter; and
a frequency divider,
wherein a second switch in said sampled loop filter has switching times that are non-overlapping with switching times of said at least one switch.

16. The system of claim 15, wherein said frequency divider is a fractional-N divider.

17. The system of claim 15, wherein a capacitor of said plurality of capacitors is coupled to ground from each terminal of said second switch.

18. The system of claim 15, wherein said sampled loop filter provides a filtered output voltage for said plurality of VCOs.

19. The system of claim 15, wherein a multiplexer coupled to said plurality of VCOs feeds back an output of one of said plurality of VCOs to said frequency divider.

20. The system of claim 15, wherein said at least one switch may be sub-sampled.

21. A method, comprising:
in a phase locked loop (PLL) comprising a phase frequency detector, a sampled loop filter comprising a plurality of capacitors and at least one switch, a plurality of voltage controlled oscillators (VCOs) coupled to said sampled loop filter, and a frequency divider:
generating at least one clock signal, wherein a second switch in said sampled loop filter has switching times that are non-overlapping with switching times of said at least one switch.

22. The method of claim 21, wherein said frequency divider is a fractional-N divider.

23. The method according to claim 21, wherein a capacitor of said plurality of capacitors is coupled to ground from each terminal of said second switch.

24. The method of claim 21, wherein said sampled loop filter provides a filtered output voltage for said plurality of VCOs.

25. The method of claim 21, wherein a multiplexer coupled to said plurality of VCOs feeds back an output of one of said plurality of VCOs to said frequency divider.

26. The method of claim 21, comprising sub-sampling said at least one switch.

27. A system, comprising:
a phase locked loop (PLL), said PLL comprising:
a phase frequency detector;
a sampled loop filter comprising a plurality of capacitors and at least one switch, wherein a second switch in said sampled loop filter has switching times that are non-overlapping with switching times of said at least one switch;
a plurality of voltage controlled oscillators (VCOs) coupled to said sampled loop filter; and
a frequency divider,
wherein said PLL is operable to:
sample an output signal from the phase frequency detector utilizing said at least one switch in said sampled loop filter; and
generate a clock signal utilizing one of said plurality of VCOs that receives an output voltage from said sampled loop filter.

28. The system of claim 27, wherein said frequency divider is a fractional-N divider.

* * * * *